United States Patent [19]

Malhi

[11] Patent Number: 5,777,363

[45] Date of Patent: Jul. 7, 1998

[54] SEMICONDUCTOR DEVICE WITH COMPOSITE DRIFT REGION

[75] Inventor: Satwinder Malhi, Garland, Tex.

[73] Assignee: Texas Instruments Incorporated, Dallas, Tex.

[21] Appl. No.: 819,495

[22] Filed: Mar. 17, 1997

Related U.S. Application Data

[63] Continuation of Ser. No. 663,859, Jun. 19, 1996, abandoned, which is a continuation of Ser. No. 474,275, Jun. 7, 1995, abandoned, which is a division of Ser. No. 158,670, Nov. 29, 1993, Pat. No. 5,510,275.

[51] Int. Cl.$^6$ .................................................. H01L 29/76
[52] U.S. Cl. ................................... 257/343; 257/192
[58] Field of Search ........................... 257/192, 196, 257/200, 335, 336, 339, 343, 347, 492, 493, 613, 77

[56] References Cited

U.S. PATENT DOCUMENTS

| | | | |
|---|---|---|---|
| 4,805,003 | 2/1989 | Holm et al. | 257/192 |
| 4,826,784 | 5/1989 | Salerno et al. | 437/89 |
| 4,884,116 | 11/1989 | Shirai | 257/328 |
| 4,914,053 | 4/1990 | Matyi et al. | 437/90 |
| 4,922,327 | 5/1990 | Mena et al. | 257/339 |
| 4,925,810 | 5/1990 | Kano et al. | 437/105 |
| 5,086,332 | 2/1992 | Nakagawa et al. | 357/51 |
| 5,306,652 | 4/1994 | Kwon et al. | 437/40 |
| 5,338,965 | 8/1994 | Malhi | 257/492 |
| 5,346,835 | 9/1994 | Malhi et al. | 437/41 |
| 5,349,207 | 9/1994 | Malhi | 257/76 |
| 5,350,932 | 9/1994 | Malhi | 257/67 |
| 5,378,912 | 1/1995 | Pein | 257/77 |
| 5,589,695 | 12/1996 | Malhi | 257/77 |

FOREIGN PATENT DOCUMENTS

| | | | |
|---|---|---|---|
| 62-115781 | 5/1987 | Japan | 257/192 |
| 62-216364 | 9/1987 | Japan | 257/198 |
| 01-21961 | 1/1989 | Japan | 257/198 |

*Primary Examiner*—Mark V. Prenty
*Attorney, Agent, or Firm*—Michael K. Skrehot; David Denker; Richard L. Donaldson

[57] ABSTRACT

A power semiconductor device is shown to comprise a source region (24) and a drain region (26) disposed in a semiconductor substrate (10). A channel region (30) is disposed inwardly from a gate oxide layer (18) and a gate conductor (20). The device comprises a composite drift region (38) is formed of an n-type region (12) and a gallium arsenide region (36).

6 Claims, 2 Drawing Sheets

SEMICONDUCTOR DEVICE WITH COMPOSITE DRIFT REGION

This application is a continuation of application Ser. No. 08/663,858, filed 19 Jun. 1996, now abandoned, which is a continuation of application Ser. No. 08/474,275, filed 7 Jun. 1995, now abandoned, which is a divisional of application Ser. No. 08/158,670, filed 29 Nov. 1993, now U.S. Pat. No. 5,510,275.

TECHNICAL FIELD OF THE INVENTION

This invention relates in general to the field of electronic devices and more particularly to an improved semiconductor power device comprising a composite drift region.

BACKGROUND OF THE INVENTION

Semiconductor power devices such as power MOSFETs have been used to replace electromechanical relays in a variety of applications. Electromechanical relays are mechanical systems and therefore have a limited lifetime. In order to adequately replace the relays, the power devices must be able to withstand high voltages and carry large amounts of current. For example, in automotive applications, battery voltages are on the order of 12 volts but noise spikes within the automotive wiring harness can cause momentary voltage spikes up to 60 volts. In addition, automotive applications can often require current loads up to and exceeding 20 amps.

Power devices have been characterized with a figure of merit which can be written as:

$$\text{Figure of merit} = R_{DS(ON)} \times A$$

This figure of merit characterizes the product of the area of a device and the source drain resistance of a power device when the power device is conducting electricity and should be minimized. The units of the figure of merit are $m\Omega \cdot cm^2$. The lower the figure of merit for a power device, the more current for a given area the device can conduct. State of the art devices with a breakdown voltage of 60V have a figure of merit of about 1 $m\Omega \cdot cm^2$.

Drift regions are included in power MOSFET devices between the drain contact and the channel region to enable the power MOSFET to conduct large amounts of current at large voltages. The figure of merit of a particular device can be related to the material properties used to construct the device and the drift region associated with the device. For example, due to the mobility, relative dielectric constant, and critical field associated with different substances, gallium arsenide will have about a 10 times lower figure of merit than silicon and silicon carbide will have about a 100 times lower figure of merit than silicon. However, gallium arsenide and silicon carbide are very expensive materials and cannot be used to efficiently create the remaining structures associated with the device. For example, gallium arsenide cannot be used to grow a thin gate oxide necessary for the operation of the power MOSFET.

SUMMARY OF THE INVENTION

Accordingly, a need has arisen for a semiconductor device that capitalizes on the low figure of merit of particular semiconductor materials, but still creates efficient and inexpensive MOS power devices.

In accordance with the teachings of the present invention, a power MOSFET architecture and method of construction are disclosed that substantially reduces or eliminates disadvantages associated with prior devices.

According to one embodiment of the present invention, a MOS device is provided that comprises a source region, a gate conductor insulated from a channel region, and a drain region. The device further comprises a composite drift region disposed between the channel region and the drain region. The composite drift region comprises a silicon drift region and a second semiconductor region disposed adjacent to the silicon drift region comprising a different semiconductor material.

BRIEF DESCRIPTION OF THE DRAWINGS

A more complete understanding of the advantages of the present invention may be acquired by referring to the Detailed Description of the Invention with the accompanying, in which like reference numbers indicate like features a wherein.

DETAILED DESCRIPTION OF THE INVENTION

Figure 1A:
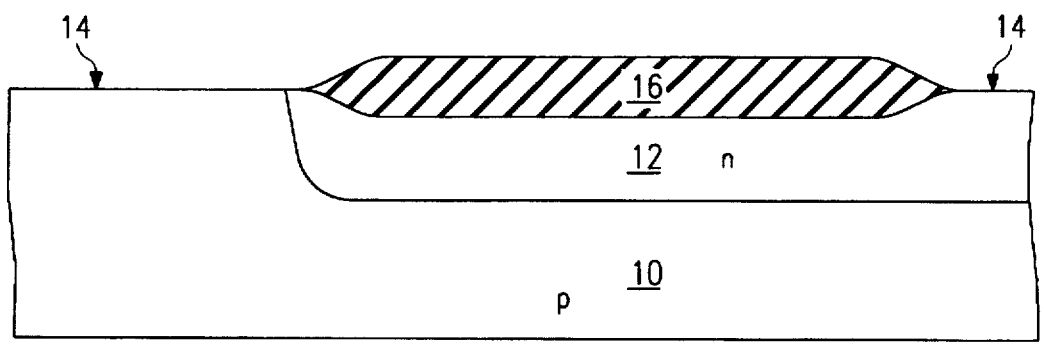
FIGS. 1a through 1f are cross-sectional elevation illustrations of a sequence of steps used to create one embodiment of the device of the present invention.

Referring to FIG. 1a, one embodiment of the device of the present invention may be constructed on a p-type silicon substrate 10 which may comprise a dopant density on the order of $5 \times 10^{15}$ cm$^3$ of a p-type dopant such as boron. An n-type region 12 is formed in substrate 10 by implanting n-type impurities such as arsenic having a dose on the order of $5 \times 10^{11}$ cm$^{-2}$ through an outer surface 14 of substrate 10. The arsenic impurities are implanted through surface 14 and then driven into the interior of substrate 10 by heating substrate 10 until the n-region 12 is on the order of one micron in depth. The outer surface 14 of substrate 10 is then patterned to expose a portion of the outer surface of region 12. A field oxide layer 16 is then grown as shown in FIG. 1a to a thickness of one micron. Field oxide layer 16 comprises silicon dioxide.

Figure 1B:
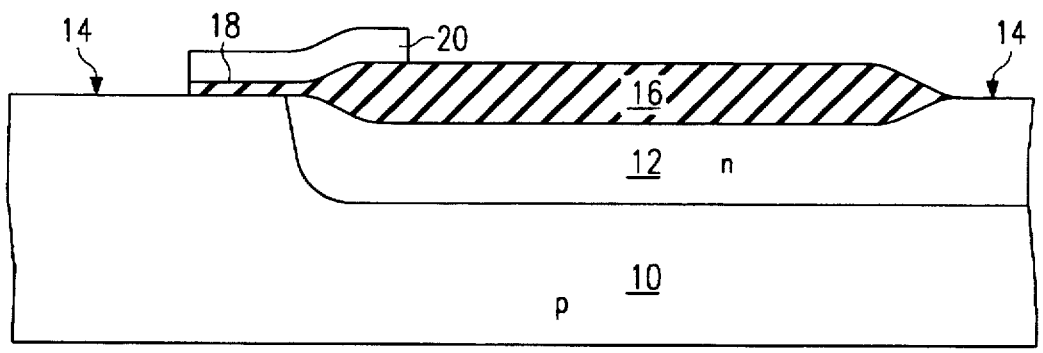

Referring to FIG. 1b, a gate oxide complete layer (not shown) is grown on the outer surface 14 of semiconductor substrate 10. The gate oxide layer is grown to a thickness on the order of 200 angstroms. A layer of polycrystalline silicon complete layer (not shown) is then deposited outwardly from the gate oxide layer to a depth on the order of half micron. The polycrystalline silicon layer is doped with n-type impurities such as phosphorus to render it conductive. The polycrystalline layer is patterned and etched to form gate conductor 20 shown in FIG. 1b.

Figure 1C:
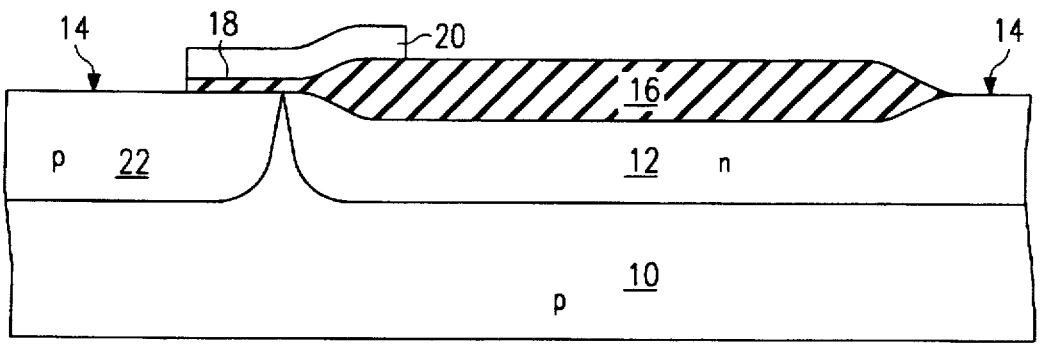

Referring to FIG. 1c, a p-region 22 is formed in substrate 10 by implanting p-type impurities such as boron having a dose on the order of $3 \times 10^{12}$ cm$^{-2}$ through surface 14 of substrate 10. This implant procedure is self-aligned to the edge of gate conductor 20. The drive-in process causes the boron impurities within p-region 22 to diffuse laterally until p-region 22 abuts n-region 12 inwardly from gate oxide 18. The drive-in process causes p-region 22 to be on the order of one to two microns in depth.

Figure 1D:
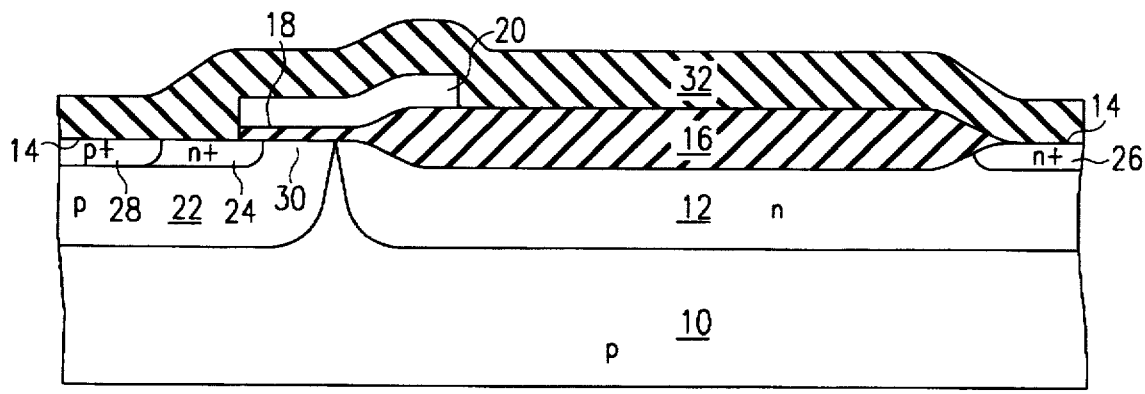

Referring to FIG. 1d, the outer surface 14 in substrate 10 is patterned to expose regions proximate the edge of gate body 20 and the opposite edge of field oxide layer 16. An n-type implant of, for example, arsenic is used to form n-plus source region 24 and n-plus drain region 26 shown in FIG. 1d. A similar process is then used to implant boron through outer surface 14 in a region proximate to source region 24 to create a p-plus body contact region 28 shown in FIG. 1d. A drive-in process is then used to heat substrate 10. The drive-in process causes the n-type ions within source region 24 to migrate slightly through substrate 10 such that a portion of source region 24 is disposed inwardly from gate oxide layer 18. Source region 24 and the boundary of p-region 22 and n-region 12 define a channel region 30 shown in FIG. 1d disposed within p-region 22 between source region 24 and n-region 12. According to the conventional operation of semiconductor field effect devices, a voltage placed on gate body 20 will selectively effect the conductance of channel region 30 to allow or inhibit the flow of current through channel region 30 between source region 24 and drain region 26.

Referring again to FIG. 1d, a mask layer 32 is deposited outwardly from and covering semiconductor substrate 10, gate conductor 20, and field oxide layer 16. Mask layer 32 may comprise, for example, on the order of 5,000 angstroms of silicon dioxide.

Figure 1E:
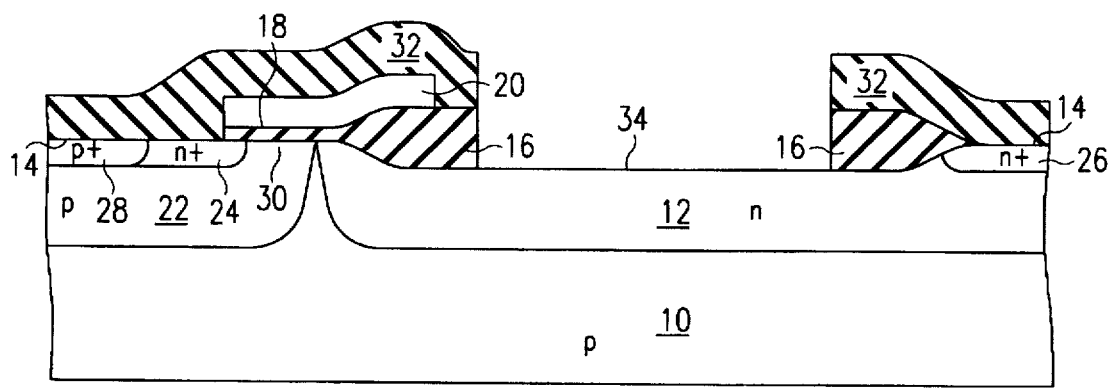

Referring to FIG. 1e, mask layer 32 is patterned and a selective etching process is used to remove portions of mask layer 32 and field oxide layer 16 to expose an outer surface 34 of n-region 12 of substrate 10.

Figure 1F:
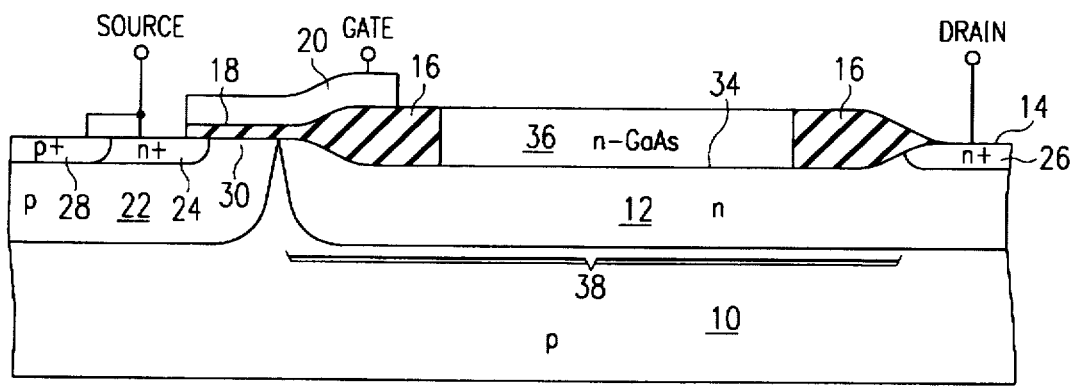

Referring to FIG. 1f, a gallium arsenide drift region 36 is formed on surface 34 by epitaxially growing gallium arsenide material to a thickness on the order of one micron. During the epitaxial process, the gallium arsenide material forming region 36 is doped in situ such that is has a dopant density on the order of $2 \times 10^{16}$ cm$^{-3}$. Region 36 is doped using n-type ions such as sulphur. Other materials such as silicon carbide may also be used to form region 36.

Conventional methods are then used to form electrical contacts (not shown) to source region 24, drain region 26, body contact 28, and gate conductor 20 to complete formation of the device. In operation, drift region 36 and n-type region 12 within substrate 10 form a composite drift region 38. The dopant levels within n-type region 12 and drift region 36 are adjusted such that the majority of carriers will pass through drift region 36. The dopant concentrations are adjusted in this manner to capitalize on the lower figure of merit associated with the gallium arsenide material within drift region 36.

The composite drift region 38 formed by n-region 12 and drift region 36 are constructed as reduced surface field (RESURF) regions. RESURF regions are constructed by adjusting the dopant concentration and depth of the region to ensure that the entire region will deplete before breakdown voltage is achieved for the region. By constructing the composite drift region 38 as a RESURF region, the resistance of the composite drift region 38 is optimized.

The architecture of the device of the present invention allows for the construction of efficient power MOS devices using conventional silicon substrates and silicon dioxide gate oxides. The architecture also capitalizes on the low figure of merit associated with gallium arsenide by incorporating a gallium arsenide region 36 within composite drift region 38. Accordingly, the superior characteristics of the gallium arsenide material are combined with the ability of silicon material to form inexpensive and efficient field effect devices.

Figure 2:
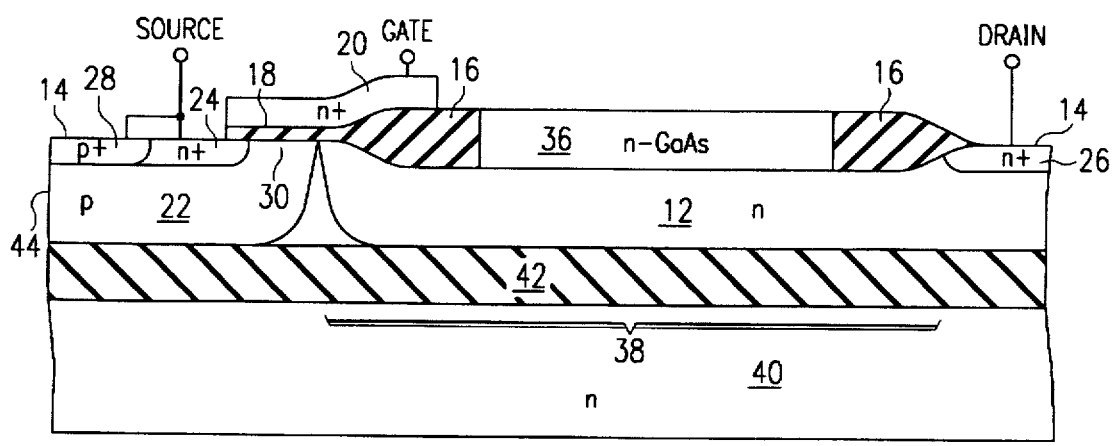
FIG. 2 is an cross-sectional elevational diagram illustrating the construction of an alternate embodiment of the device of the present invention.

Referring to FIG. 2, a second embodiment of the power device of the present invention is shown. The device in FIG. 2 is essentially identical to the device discussed with reference to FIGS. 1a through 1f except that the device shown in FIG. 2 is constructed on a silicon-on-insulator substrate. The device in FIG. 2 is constructed on an n-type substrate 40. An insulator layer 42 is formed on the outer surface of substrate 40. Insulator layer 24 may comprise, for example, a layer of silicon dioxide on the order of one micron in thickness. The device is then constructed in a silicon layer 44 formed outwardly from insulator layer 42. Layer 44 may comprise, for example, a layer of silicon on the order of one micron in thickness. The device shown in FIG. 2 is then constructed using the identical methods discussed with reference to FIGS. 1a through 1f to form the layers and regions shown in FIG. 2.

The silicon-on-insulator power device shown in FIG. 2 is useful in an application where many power devices may be constructed on a single substrate where the sources of the devices cannot be connected. This situation can occur, for example, when many high-side driver circuits are formed which are required to drive different inductive loads. In this situation, the sources of the devices cannot be connected. The silicon-on-insulator configuration provides for the isolation of the source contacts for all of the devices constructed on the silicon-on-insulator substrate. For example, rather than using GaAs material for the composite drift region, SiC or any other suitable material may be grown to enhance the drift region performance.

Although the present invention has been described in detail, it should be understood that various changes, substitutions and alterations may be made to the embodiments herein without departing from the spirit and scope of the present invention which is solely defined by the appended claims.

What is claimed is:

1. A field-effect semiconductor device comprising:
   a semiconductor substrate;
   a source region disposed in the semiconductor substrate;
   a drain region disposed in the semiconductor substrate;
   a gate conductor disposed adjacent to and insulated from the semiconductor substrate;
   a channel region disposed in the semiconductor substrate adjacent to the source region and proximate to and insulated to the gate conductor; and
   a composite drift region disposed between the drain region and the channel region, the composite drift region comprising first and second drift regions, the first drift region comprising a portion of the semiconductor substrate disposed between the channel region and the drain region, the second drift region disposed adjacent the first drift region, the second drift region comprising a layer of semiconductor material different than the material of the first drift region, the second drift region physically insulated from the drain region, and the second drift region insulated from the gate conductor.

2. The semiconductor device of claim 1 wherein the second drift region comprises gallium arsenide.

3. The semiconductor device of claim 1 wherein the semiconductor substrate comprises a first semiconductor substrate, the device further comprising:
   an insulator layer disposed inwardly from the semiconductor substrate; and
   a second semiconductor substrate disposed adjacent the insulator layer and separated from the first semiconductor substrate by the insulator layer.

4. The semiconductor device of claim 1 wherein the semiconductor substrate comprises silicon.

5. The semiconductor device of claim 1 wherein the composite drift region comprises a dopant concentration and is constructed to have a depth such that the composite drift region will fully deplete prior to reaching a breakdown voltage associated with the composite drift region.

6. The semiconductor device of claim 1 wherein the first and second drift regions are doped using n-type impurities.

* * * * *